United States Patent
Wang

(10) Patent No.: US 9,281,815 B2
(45) Date of Patent: Mar. 8, 2016

(54) ELECTRODE UNIT WITH PERIMETER-LENGTHENED TOUCH-SENSING PATTERN FOR TOUCH-SENSING ELEMENT LOCATED AT FRINGES OF TOUCH PANEL

(71) Applicant: Raydium Semiconductor Corporation, Hsinchu (TW)

(72) Inventor: Sheng-Fu Wang, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 195 days.

(21) Appl. No.: 13/745,863

(22) Filed: Jan. 21, 2013

(65) Prior Publication Data

US 2013/0240342 A1 Sep. 19, 2013

(30) Foreign Application Priority Data

Mar. 13, 2012 (TW) ................ 101108423 A

(51) Int. Cl.
*G06F 3/044* (2006.01)
*G06F 3/045* (2006.01)
*H03K 17/96* (2006.01)

(52) U.S. Cl.
CPC ........... *H03K 17/9622* (2013.01); *G06F 3/044* (2013.01)

(58) Field of Classification Search
CPC .................................. G06F 3/044; G06F 3/045
USPC ........................................ 200/600; 345/172
See application file for complete search history.

(56) References Cited

U.S. PATENT DOCUMENTS

2012/0229414 A1* 9/2012 Ellis .............................. 345/174
2013/0241851 A1* 9/2013 Wang et al. ................. 345/173

* cited by examiner

*Primary Examiner* — Renee Luebke
*Assistant Examiner* — Ahmed Saeed

(57) ABSTRACT

An electrode unit on a touch-sensing element includes a first electrode and a second electrode. The first electrode includes a first conductive element; and a plurality of second conductive elements extending from the first conductive element in directions in parallel with a first direction within a specific range. The second electrode includes a third conductive element and a plurality of fourth conductive elements extending from the third conductive element in directions in parallel with a second direction within a specific range.

10 Claims, 4 Drawing Sheets

US 9,281,815 B2

ELECTRODE UNIT WITH PERIMETER-LENGTHENED TOUCH-SENSING PATTERN FOR TOUCH-SENSING ELEMENT LOCATED AT FRINGES OF TOUCH PANEL

BACKGROUND OF THE INVENTION

1. Field of the Invention

The disclosed embodiments of the present invention relate to sensing pattern design, and more particularly, to an electrode unit with a perimeter-lengthened touch-sensing pattern on a touch-sensing element located at fringes of a touch panel.

2. Description of the Prior Art

Regarding a single-layered capacitive touch panel, a touch-sensing element on a touch panel is usually implemented using longitudinal electrodes and transverse electrodes with transparent conductive materials (e.g., indium tin oxide (ITO)). When a finger touches a longitudinal electrode and a transverse electrode, an inductive capacitance between the touched longitudinal electrode and transverse electrode alters responsively. The difference of the inductive capacitance before and after the touch can then be used to calculate where the contact is.

Please refer to FIG. 1, which is a schematic diagram illustrating an example of a sensing pattern of electrodes on a conventional touch panel TP. The touch panel TP includes a plurality of touch-sensing elements TU, where each of the touch-sensing elements TU has an electrode unit 100 thereon, and the electrode unit 100 includes at least a first transverse electrode 110 and a second longitudinal electrode 120. As shown in FIG. 1, the touch-sensing elements TU are staggered as a rectangular pattern, the first electrode 110 on the same row are series-connected as a sensing trace, and the second electrode 120 on the same column are series-connected as a sensing trace. In this way, the touch panel TP would have a plurality of transverse sensing traces T1-TN and a plurality of longitudinal sensing traces S1-SM. In addition, the electrode unit 100 also has separation units constituted by insulation material and disposed on an intersection of the corresponding first electrode 110 and second electrode 120, such that the sensing traces T1-TN and sensing traces S1-SM would not be electrically connected.

However, since an area being able to induct the inductive capacitance between two adjacent electrodes (i.e., the first electrode 110 and the second electrode 120) on the touch-sensing element TU located on fringes of the touch panel TP is smaller than an area being able to induct the inductive capacitance between two adjacent electrodes (i.e., the first electrode 110 and the second electrode 120) on the touch-sensing element TU located in the middle of the touch panel TP, when the finger enters the touch panel TP from the fringe, the inductive capacitance sensed by the electrodes on the fringes is smaller than the inductive capacitance sensed by the electrodes in an effective sensing area, which is prone to misjudgment.

Therefore, there is a need to enhance the inductive capacitance sensed by the electrodes of the touch-sensing element located on the fringes of the touch panel, in order to decrease the likelihood of faulty calculation of contact on the fringes of the touch panel.

SUMMARY OF THE INVENTION

In accordance with exemplary embodiments of the present invention, an electrode unit with a perimeter-lengthened touch-sensing pattern on a touch-sensing element located at fringes of a touch panel is proposed to solve the above-mentioned problem.

According to an aspect of the present invention, an exemplary electrode unit is disclosed. The electrode unit includes a first electrode and a second electrode. The first electrode includes a first conductive element; and a plurality of second conductive elements extending from the first conductive element in directions in parallel with a first direction within a specific range. The second electrode includes a third conductive element and a plurality of fourth conductive elements extending from the third conductive element in directions in parallel with a second direction within a specific range.

Therefore, when deployed on the touch-sensing element located on the fringes of the touch panel, the present invention can decrease the likelihood of faulty calculation of contact on the fringes of the touch panel.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

When an object touches an electrode unit of a current touch-sensing element and an electrode unit on an adjacent touch-sensing element, a contact of the object can be determined by calculating the difference between an inductive capacitance C sensed by the electrode unit before and after the touch, and comparing the inductive capacitance C with an inductive capacitance C' sensed by the electrode unit on the adjacent touch-sensing element. Therefore, a concept of the present invention is to increase the inductive capacitance C sensed by a touch-sensing element located on a fringe of a touch panel by increasing contact areas being able to induct the inductive capacitance C on an electrode unit of the touch-sensing element, such that accuracy of determining the contact of the object can be improved. More specifically, since an electrode itself has a certain thickness, the present invention may increase the contact areas being able to induct the inductive capacitance C by increasing a perimeter of a sensing pattern formed by the electrode unit.

Figure 1:
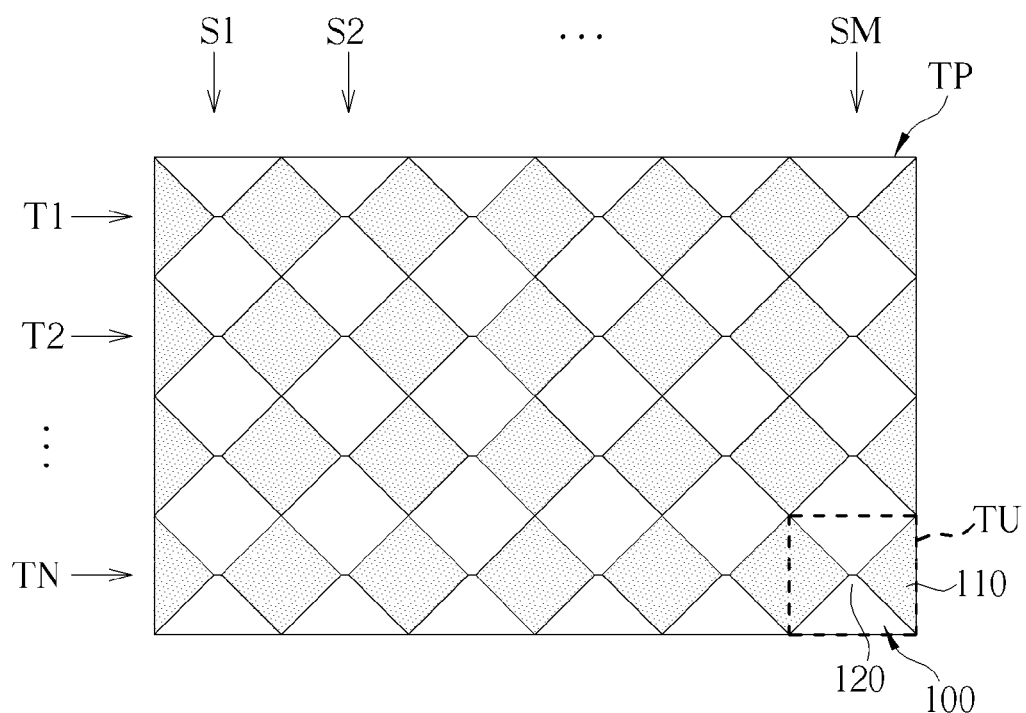
FIG. 1 is a schematic diagram illustrating an example of a sensing pattern of electrodes on a conventional touch panel.
Figure 2:
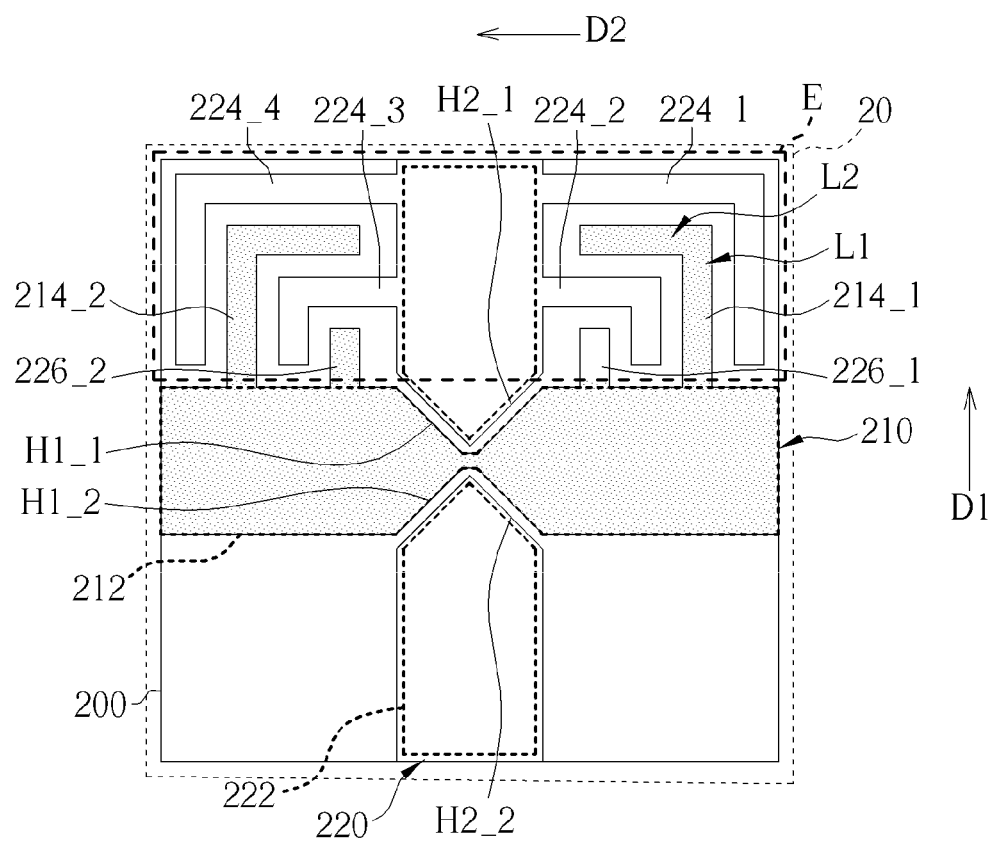
FIG. 2 is a schematic diagram illustrating a sensing pattern of an electrode unit according to a first embodiment of the present invention.

Please refer to FIG. 2, which is a schematic diagram illustrating a sensing pattern of an electrode unit 200 according to a first embodiment of the present invention. The electrode unit 200 is disposed on a touch-sensing element 20, and the touch-sensing element 20 in this embodiment is a capacitive touch-sensing element located on a fringe of an M×N touch-sensing element array, where M and N may be any integers. In FIG. 2, the electrode unit 200 includes a first electrode 210 and a second electrode 220. In addition, the electrode unit 200 also has a separation unit (not shown in FIG. 2) constituted by insulation material disposed at an intersection of the first electrode 210 and the second electrode 220 and located in between the first electrode 210 and the second electrode 220, such that the first electrode 210 and the second electrode 220 are not electrically connected. Therefore, there may be an inductive capacitance inducted between the first electrode 210 and the second electrode 220.

In this embodiment, the first electrode 210 includes (but not limited to) a first conductive element 212 and a plurality of second conductive elements 214_1, 214_2. The first conductive element 212 is strip-shaped and has a plurality of first funnel-shaped notches H1_1 and H1_2 located on both sides, respectively. The second conductive elements 214_1-214_2 are strip-shaped, and extend from the first conductive element 212 in directions in parallel with a first direction D1 within a specific range E. Each of the second conductive elements 214_1, 214_2 include a first section L1 and a second section L2, the first section L1 extends in directions in parallel with the first direction D1, and the second section L2 is not in parallel with the first section L1. In other words, a joint of the first section L1 and the second section L2 of each of the second conductive elements 214_1, 214_2 forms a bent part.

The second electrode 220 includes a third conductive element 222 and a plurality of fourth conductive elements 224_1-224_4. The third conductive element 222 is strip-shaped, and has a plurality of second funnel-shaped notches H2_1 and H2_2 on both sides, respectively. The conductive elements 214_1-214_4 are strip-shaped, and extend from the third conductive element 222 in directions in parallel with a second direction D2 (in this embodiment, the first direction D1 is perpendicular to the second direction D2; however, it is for illustrative purpose only) within the specific range E. Each of the fourth conductive elements 224_1-224_4 includes a first section L1' and a second section L2', and the first section L1' extends in directions in parallel with the second direction D2, and the second section L2' is not in parallel with the first section L1. In other words, a joint of the first section L1' and the second section L2' of each of the fourth conductive elements 224_1-224_4 forms a bent part.

Please note that, in this embodiment, the first section L1 and its corresponding second section L2 of each of the second conductive elements 214_1, 214_2 are perpendicular to each other, and each of the second conductive elements 214_1, 214_2 has only one bent part. In addition, the first section L1' and its corresponding second section L2' of each of the fourth conductive elements 224_1-224_4 are perpendicular to each other, and each of the fourth conductive elements 224_1-224_4 has only one bent part. However, it is for illustrative purpose only, and not meant to be a limitation of the present invention. For example, in another embodiment, at least one of the second conductive elements 214_1, 214_2 may include a first section, a second section and a third section, where the first section is not in parallel with the second section, and the second section is not in parallel with the third section. At this moment, the conductive element which includes the first section, the second section and the third section would have two bent parts. Namely, each of the second conductive elements 214_1, 214_2 would have at least one bent part. Besides, the first electrode 210 may further include a plurality of fifth conductive elements 226_1-226_N (which are optional elements), which straightly extend from the first conductive element 212 in directions in parallel with the first direction D1.

In short, the concept of the present invention is to enlarge the area that is able to induct the inductive capacitance by extending a plurality of strip-shaped conductive parts (e.g., the second conductive elements, the fourth conductive elements and/or the fifth conductive elements) from a main conductive part (e.g., the first conductive element and/or the third conductive element) in the specific range E. Namely, the extended conductive elements may either have no bent part or have different numbers of bent parts. Please note that, in this embodiment, all of the conductive elements may be realized by indium tin oxide (ITO). In addition, the number of the second conductive elements, the number of the fourth conductive elements and/or the number of the fifth conductive elements utilized in this embodiment are for illustrative purpose only, and are not meant for a limitation of the present invention. Those skilled in the art may increase/decrease the number of the second conductive elements, the number of the fourth conductive elements and/or the number of the fifth conductive elements according to actual design requirement.

Besides, the specific range E depends on fringes of the first conductive element 212, the third conductive element 222 and a touch active area A. The touch active area A is an area on a touch panel that is covered by touch sensing elements (i.e., an area covered by the M×N array). For example, please refer to FIG. 3, which is a schematic diagram illustrating an embodiment of the specific range E. If an upper edge of the electrode unit 200 is a fringe of the touch active area A (as shown in this embodiment), the specific range E may be defined as an area E1 in between the first conductive element 212 and the fringe of the touch active area A, as shown in the sub-diagram (C) of FIG. 3. Similarly, if a lower edge of the electrode unit 200 is an edge of the touch active area A, the specific range E may be defined as an area E2 in between the first conductive element 212 and the fringe of the touch active area A, as shown in the sub-diagram (D) of FIG. 3. In the same notion, if a right/left edge of the electrode unit 200 is an edge of the touch active area A, the specific range E may be defined as an area E3/E4 in between the third conductive element 222 and the fringe of the touch active area A, as shown in sub-diagrams (A) and (B) of FIG. 3, respectively.

Figure 4:
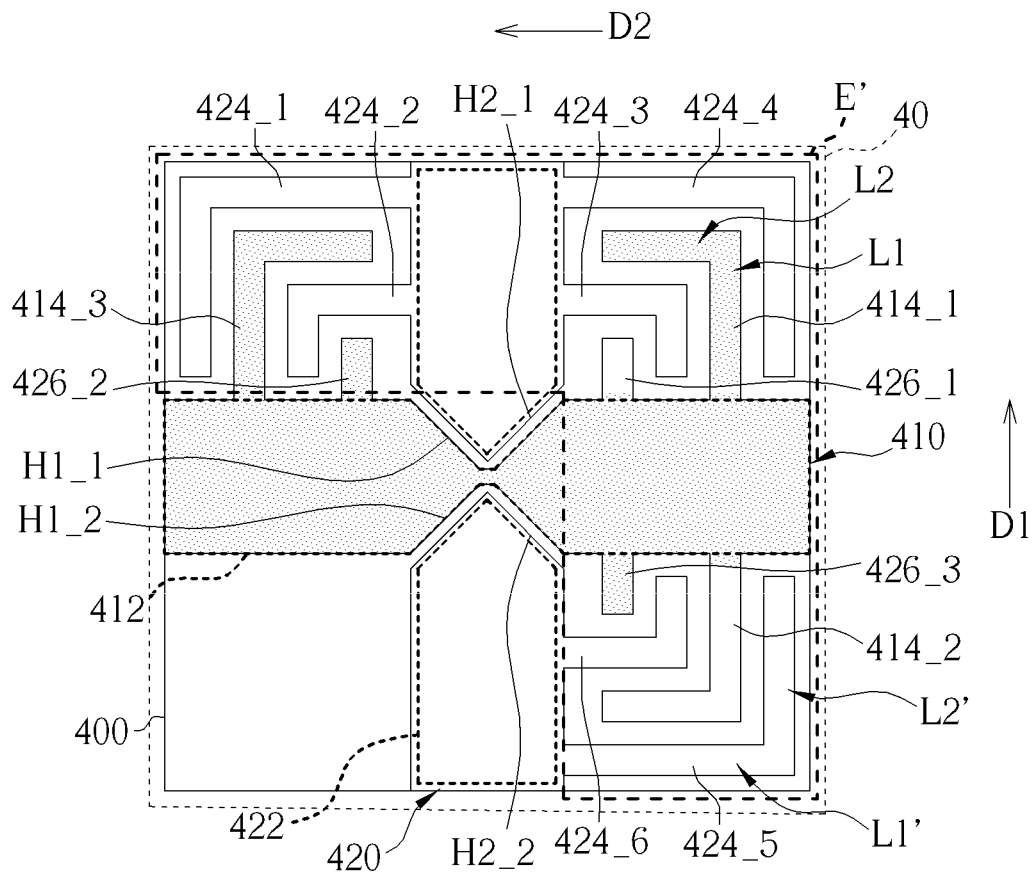
FIG. 4 is a schematic diagram illustrating a sensing pattern of an electrode unit according to a second embodiment of the present invention.

Please refer to FIG. 4, which is a schematic diagram illustrating a sensing pattern of an electrode unit 400 according to a second embodiment of the present invention. The electrode unit 400 is disposed on a touch-sensing element 40. In this embodiment, the touch-sensing element 40 is a capacitive touch-sensing element, located at one of corners of the touch-sensing element array (e.g., an upper-left corner, an upper-right corner, a lower-left corner or a lower-right corner). In FIG. 4, the electrode unit 400 includes a first electrode 410 and a second electrode 420. In addition, the electrode unit 400 also has a separation unit (not shown in FIG. 4) that is constituted by insulation material, disposed at an intersection of the first electrode 410 and the second electrode 420 and located in between the first electrode 410 and the second electrode 420, such that the first electrode 410 and the second electrode 420 are not electrically connected. Therefore, there may be an inductive capacitance inducted between the first electrode 410 and the second electrode 420.

In this embodiment, the first electrode 410 includes a first conductive element 412 and a plurality of second conductive elements 414_1, 414_2. The first conductive element 412 is strip-shaped and has a plurality of first funnel-shaped notches H1_1 and H1_2 on both sides, respectively. The second conductive elements 414_1, 414_2 extend from the first conductive element 412 in directions in parallel with a first direction D1 in a specific range E'. Each of the second conductive elements 414_1, 414_2 includes a first section L1 and a second section L2, where the first section L1 extends in directions in parallel with the first direction D1, and the second section L2 is not in parallel with the first section L1. In other words, a joint of the first section L1 and the second section L2 of each of the second conductive elements 414_1, 414_2 forms a bent part.

The second electrode 420 includes a third conductive element 422 and a plurality of fourth conductive elements 424_1-424_4. The third conductive element 422 is strip-shaped and has a plurality of second funnel-shaped notches H2_1 and H2_2 on both sides, respectively. The fourth conductive elements 414_1-414_4 extend from the third conductive element 422 in directions in parallel with a second direction D2 (in this embodiment, the first direction D1 is perpendicular to the second direction D2; however, it is for illustrative purpose only) in the specific range E'. Each of the fourth conductive elements 424_1-424_4 includes a first section L1' and a second section L2', where the first section L1' extends in directions in parallel with the second direction D2, and the second section L2' is not in parallel with the first section L1. In other word, a joint of the first section L1' and the second section L2' of each of the fourth conductive elements 424_1-424_4 forms a bent part. The first section L1 and its corresponding second section L2 of each of the second conductive elements 414_1, 414_2 are perpendicular to each other, and each of the second conductive elements 414_1, 414_2 has only one bent part. In addition, the first section L1' and its corresponding second section L2' of each of the fourth conductive elements 424_1-424_4 are perpendicular to each other, and each of the fourth conductive elements 424_1-424_4 has only one bent part. Besides, the first electrode 410 may further include a plurality of fifth conductive elements 426_1-426_6 (which are optional elements), straightly extending from the first conductive element 412 in directions in parallel with the first direction D1.

Figure 3:
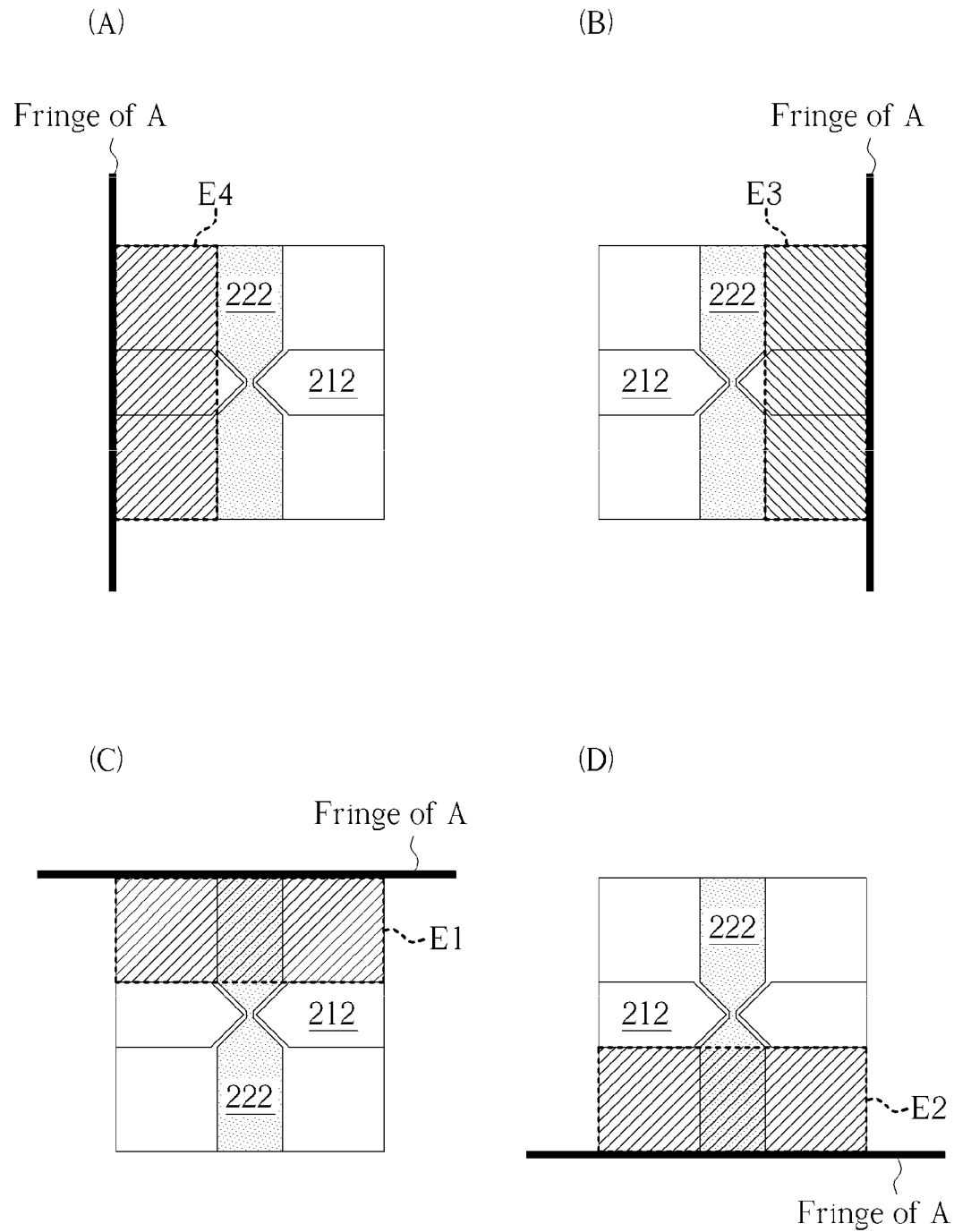
FIG. 3 is a schematic diagram illustrating an embodiment of the specific range.

Please note that, the specific range E' shown in FIG. 4 is a union of the range E1 and the range E3 shown in FIG. 3. Those skilled in the art should readily understand operations of the electrode unit 400 FIG. 4 after reading the above-mentioned paragraphs directed to the electrode unit 200. Hence, detailed descriptions and modifications may refer to the above and are therefore omitted here for brevity.

To sum up, according to the present invention, the electrode unit 200/400 may increase contact areas arranged for inducting the inductive capacitance C by increasing the perimeter of the sensing pattern formed by the first electrode 210/410 and the second electrode 220/420, so as to increase the value of the inductive capacitance C sensed by the touch-sensing element located on the fringes of the touch panel, and thus may decrease the likelihood of faulty calculation of contact on the fringes of the touch panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrode unit on a touch-sensing element, comprising:
   a first electrode, comprising:
      a first conductive element; and
      a plurality of second conductive elements, extending from the first conductive element in directions in parallel with a first direction within a specific range and at least one of the second conductive elements comprising a first part and a second part, wherein there is an included angle between the first part and the second part, and the included angle is smaller than 180 degrees; and
   a second electrode, comprising:
      a third conductive element; and
      a plurality of fourth conductive elements, extending from the third conductive element in directions in parallel with a second direction within a specific range and at least one of the fourth conductive elements comprising a third part and a fourth part, wherein there is an included angle between the third part and the fourth part, and the included angle is smaller than 180 degrees.

2. The electrode unit of claim 1, wherein the first electrode and the second electrode are not electrically connected.

3. The electrode unit of claim 1, wherein the specific range depends on fringes of the first conductive element, the third conductive element and a touch active area.

4. The electrode unit of claim 1, wherein the first conductive element has a plurality of funnel-shaped notches.

5. The electrode unit of claim 4, wherein the plurality of second conductive elements are strip-shaped, each of the plurality of second conductive elements includes a first section and a second section, the first section extends in directions in parallel with the first direction, and the second section is not in parallel with the first section.

6. The electrode unit of claim 5, further comprising:
   a plurality of fifth conductive elements, straightly extending from the first conductive element in directions in parallel with the first direction.

7. The electrode unit of claim 1, wherein the third conductive element has a plurality of funnel-shaped notches.

8. The electrode unit of claim 7, wherein the plurality of fourth conductive elements are strip-shaped, each of the plurality of fourth conductive elements includes a first section and a second section, the first section extends in directions in parallel with the second direction, and the second section is not in parallel with the first section.

9. The electrode unit of claim 1, wherein the touch-sensing element is a capacitive touch-sensing element.

10. The electrode unit of claim 1, wherein the first electrode and the second electrode are indium tin oxide (ITO).

* * * * *